(12) United States Patent
Kim et al.

(10) Patent No.: US 11,755,897 B2
(45) Date of Patent: Sep. 12, 2023

(54) ARTIFICIAL NEURAL NETWORK CIRCUIT

(71) Applicant: SAMSUNG ELECTRONICS CO., LTD., Suwon-si (KR)

(72) Inventors: Jae-Joon Kim, Pohang-si (KR); Hyungjun Kim, Pohang-si (KR); Yulhwa Kim, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/094,351

(22) Filed: Jan. 7, 2023

(65) Prior Publication Data

US 2023/0153594 A1    May 18, 2023

Related U.S. Application Data

(63) Continuation of application No. 16/687,599, filed on Nov. 18, 2019, now Pat. No. 11,580,368.

(30) Foreign Application Priority Data

Nov. 19, 2018  (KR) ......................... 10-2018-0142913

(51) Int. Cl.
  *G06N 3/00*      (2023.01)
  *G06N 3/063*     (2023.01)
  (Continued)

(52) U.S. Cl.
  CPC ............... *G06N 3/063* (2013.01); *G06N 3/04* (2013.01); *G11C 11/54* (2013.01); *G11C 13/004* (2013.01); *G11C 13/0069* (2013.01)

(58) Field of Classification Search
  CPC .......... G06N 3/063; G06N 3/04; G11C 11/54; G11C 13/004
  (Continued)

(56) References Cited

U.S. PATENT DOCUMENTS

| | | | |
|---|---|---|---|
| 5,247,206 A | 9/1993 | Castro | |
| 2011/0051483 A1* | 3/2011 | Chang | G11C 11/5678 365/49.1 |

(Continued)

FOREIGN PATENT DOCUMENTS

| | | |
|---|---|---|
| KR | 10-2017-0084020 A | 7/2017 |
| KR | 10-2018-0020078 A | 8/2018 |

OTHER PUBLICATIONS

Kim, Yulhwa, et al., "Neural Network-Hardware Co-Design for Scalable RRAM-based BNN Accelerators." arXiv:1811.02187v2 [cs.NE] Apr. 15, 2019, (6 pages in English).

(Continued)

*Primary Examiner* — Vu A Le
(74) *Attorney, Agent, or Firm* — NSIP Law

(57) ABSTRACT

Provided is an artificial neural network circuit including unit weight memory cells including weight memory devices configured to store weight data and weight pass transistors, unit threshold memory cells including a threshold memory device programmed to store a threshold and a threshold pass transistor, a weight-threshold column in which the plurality of unit weight memory cells and the plurality of unit threshold memory cells are connected, and a sense amplifier configured to receive an output signal of the weight-threshold column as an input and receive a reference voltage as another input.

8 Claims, 3 Drawing Sheets

(51) Int. Cl.
   *G11C 11/54* (2006.01)
   *G06N 3/04* (2023.01)
   *G11C 13/00* (2006.01)
(58) Field of Classification Search
   USPC .......................................................... 706/41
   See application file for complete search history.

(56) References Cited

U.S. PATENT DOCUMENTS

| | | |
|---|---|---|
| 2013/0028010 A1* | 1/2013 | Li .................. G11C 11/1675 365/158 |
| 2017/0116512 A1 | 4/2017 | Kurokawa |
| 2018/0053550 A1 | 2/2018 | Rakshit et al. |
| 2018/0300618 A1 | 10/2018 | Obradovie et al. |

OTHER PUBLICATIONS

Xia, Lixue, et al. "Switched by input: Power Efficient Structure for RRAM-based Convolutional Neural Network." Proceedings of the 53rd Annual Design Automation Conference. 2016, (6 pages in English).

* cited by examiner

ARTIFICIAL NEURAL NETWORK CIRCUIT

CROSS-REFERENCE TO RELATED APPLICATION

This application is a continuation of application Ser. No. 16/687,599 filed on Nov. 18, 2019, which claims the benefit under 35 USC 119(a) of Korean Patent Application No. 10-2018-0142913, filed on Nov. 19, 2018, the disclosures of which are incorporated herein by reference in their entirety for all purposes.

BACKGROUND

1. Field of the Invention

The present invention relates to an artificial neural network circuit and more particularly, to a batch normalization device based on a resistive memory in a binary neural network.

2. Discussion of Related Art

To overcome structural limitations of chips based on existing Von Neumann architecture, integrated circuit (IC) chip development companies have been developing neural network hardware or neuromorphic hardware based on neural networks composed of neurons which are fundamental units of a human brain, synapses which connect the neurons to each other, and the like. Neural networks overcome limitations of existing machine learning algorithms and exhibit capabilities of learning and recognizing images, videos, and patterns at a level close to a human. These days, neural networks are being used in a number of fields. Numerous companies and researchers are developing dedicated application specific integrated circuit (ASIC) chips to rapidly perform calculation of such a neural network with lower power.

Like a human brain, a neural network is formed of neurons connected to each other and performs learning and inference. The neural network includes the neurons and synapses connecting the neurons. The degree of connectivity between neurons may be strong or weak and is referred to as weight.

Training a neural network is a process of establishing a network and controlling a weight value until a target value is output when data to be learned is input to the established network.

The process of training a neural network may be illustrated as a process of representing weight values between n neurons and m neurons as an n×m weight matrix and changing element values of the matrix. Also, a process of performing inference using a neural network may be illustrated as a process of multiplying a vector provided by a neuron and a weight matrix together.

A resistive memory is a non-volatile memory which represents weight information with the resistance (or conductivity) of the corresponding device. Resistive memories arranged in a crossbar array may be used as an analog vector-matrix multiplier. When a vector corresponds to a voltage applied to each row of the memory array and a matrix corresponds to the conductivities of devices of the memory array, a current output to each column of the memory array becomes a result value of vector-matrix multiplication according to Ohm's law and Kirchhoff's law. While an existing complementary metal-oxide semiconductor (CMOS)-based vector-matrix multiplier has a complexity of 0 ($n^2$), a vector-matrix multiplier based on a resistive memory array has a complexity of 0 (1) and thus is highly expected as an artificial neural network circuit.

Batch normalization is a learning technique used in a deep neural network. According to batch normalization, the distribution of neurons in one batch is normalized to accelerate a training rate and a final recognition rate of a trained neural network. General batch normalization provides a mean, a variance, a weight, and a bias of each neuron, and these parameters determined in a learning process are used in an inference process.

In a binary neural network, batch normalization is combined with an activation function into a simple form. In the combination of batch normalization and an activation function, four parameters may be defined to be one threshold, and it is determined whether each neuron is greater or less than an allocated threshold.

SUMMARY OF THE INVENTION

In a binary neural network, batch normalization is followed by an activation function. Therefore, in a binary neural network circuit based on a resistive memory, batch normalization is applied before the result of vector-matrix multiplication is converted into a 1-bit digital value.

According to a related art, a digital-to-analog converter (DAC) is used to generate a threshold provided to a sense amplifier. However, the DAC requires a large area and increases power consumption. Also, since the sense amplifier is required to have a dynamic range corresponding to a whole range in which the threshold may vary, the required area further increases.

The present invention is directed to providing an artificial neural network circuit for reducing overall power consumption and area.

According to an aspect of the present invention, there is provided an artificial neural network circuit including: a weight column in which unit weight memory cells including weight memory devices configured to store weight data of one neuron and weight pass transistors are connected, a threshold column in which unit threshold memory cells including threshold memory devices configured to store a threshold of a neuron and threshold pass transistors are connected, and a sense amplifier configured to compare output signals of neurons output by the weight column with threshold signals output by the threshold column and output comparison results.

According to another aspect of the present invention, there is provided an artificial neural network circuit including: unit weight memory cells including weight memory devices configured to store weight data and weight pass transistors, unit threshold memory cells including a threshold memory device programmed to store a threshold and a threshold pass transistor, a weight-threshold column in which the plurality of unit weight memory cells and the plurality of unit threshold memory cells are connected, and a sense amplifier configured to receive an output signal of the weight-threshold column as an input and receive a reference voltage as another input.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The following descriptions of the present invention are merely exemplary embodiments for structural or functional descriptions, and the scope of the present invention should not be construed as being limited to the exemplary embodiments set forth herein. In other words, exemplary embodiments may be diversely changed and have various forms, and the scope of the present invention should be understood as including equivalents thereto to realize the technical idea.

Meanwhile, terminology described in this application is to be understood as follows.

It is to be understood that the singular forms include the plural forms unless the context clearly indicates otherwise. The terms "include," "have," or the like when used in this specification, specify the presence of stated features, numbers, steps, operations, elements, parts, or combinations thereof but do not preclude the presence or addition of one or more other features, numbers, steps, operations, elements, parts, or combinations thereof.

Unless a specific sequence is clearly mentioned in the context, steps may be performed out of the order noted in a flowchart. In other words, steps may be performed in the same order as stated, substantially concurrently, or in the reverse order.

Unless otherwise defined, all terms used herein have the same meaning as commonly understood by those of ordinary skill in the art to which the present invention belongs. Terms generally used, like those defined in a dictionary, should be interpreted to match the contextual meaning of related technology and should not be interpreted in an idealized or overly formal sense unless clearly so defined herein.

Hereinafter, in describing a plurality of elements having the same configuration or similar configurations according to exemplary embodiments of the present invention, elements will be described with symbols, such as 1, 2, and 3, when it is necessary to distinguish the elements one another. On the other hand, elements will be described without symbols, such as 1, 2, and 3, when it is unnecessary to distinguish the elements.

First Embodiment

Figure 1:
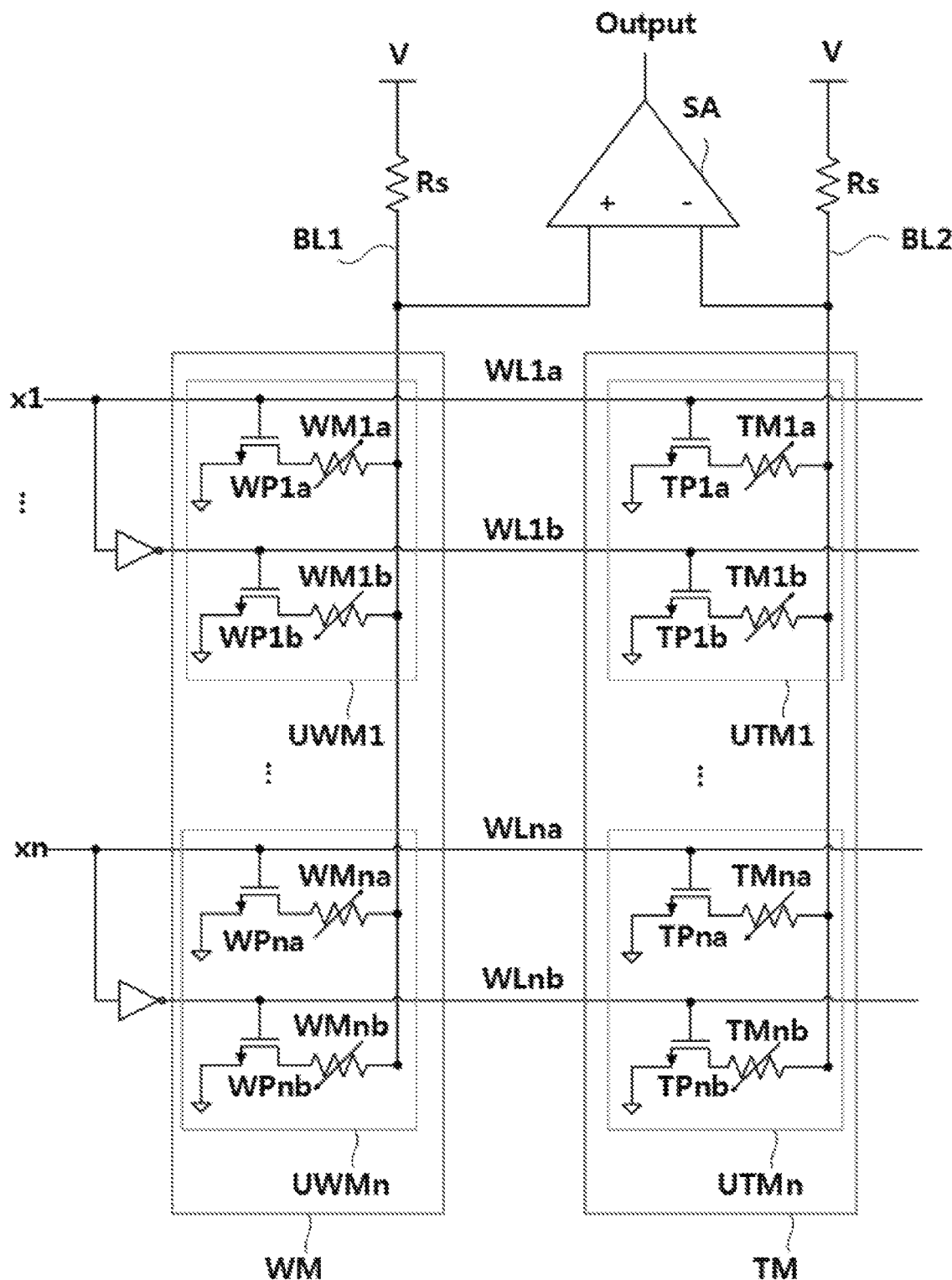
FIG. 1 is a circuit diagram showing an overview of an artificial neural network circuit according to an exemplary embodiment of the present invention.

FIG. 1 is a circuit diagram showing an overview of an artificial neural network circuit 1 according to this exemplary embodiment of the present invention. Referring to FIG. 1, the artificial neural network circuit 1 according to this exemplary embodiment includes a weight column WM in which unit weight memory cells UWM including weight memory devices WM1a, WM1b, . . . , WMna, and WMnb configured to store weight data of one neuron and weight pass transistors WP1a, WP1b, . . . , WPna, and WPnb are connected, a threshold column TM in which unit threshold memory cells UTM including threshold memory devices TM1a, TM1b, . . . , TMna, and TMnb configured to store a threshold of a neuron and threshold pass transistors TP1a, TP1b, . . . , TPna, and TPnb are connected, and a sense amplifier SA configured to compare an output signal of a neuron output by the weight column WM with a threshold sum signal output by the threshold column TM and output a comparison result.

The weight column WM includes the plurality of unit weight memory cells UWM and a bit line BL1 to which the plurality of unit weight memory cells UWM are connected. The unit weight memory cells UWM include the weight memory devices WM and the weight pass transistors WP. The weight memory devices WM are resistive memory devices, and the electric resistance between one electrode and the other electrode is changed according to stored data. The resistive memory devices are non-volatile memory devices, and data stored therein does not volatilize even when power is not provided.

The weight pass transistors WP control circuit connection between the bit line BL1 and the weight memory devices WM. In the exemplary embodiment shown in the drawing, a ground voltage is provided to the source electrodes of the weight pass transistors WP, the weight memory devices WM are connected to the drain electrodes of the weight pass transistors WP, and the weight memory devices WM are connected to the bit line BL1 In an exemplary embodiment not shown in the drawing, the ground voltage may be provided to one electrodes of the weight memory devices WM, and the other electrodes thereof may be connected to the source electrodes of the weight pass transistors WP. The drain electrodes of the weight pass transistors WP are connected to the bit line BL1.

In exemplary embodiments, when a weight pass transistor WP becomes conductive, a circuit is formed from a voltage rail V connected to one end of the bit line BL1 to the ground voltage through a resistor Rs and a weight memory device WM. When the weight pass transistor WP is blocked, the circuit is blocked between the bit line BL1 and the ground voltage.

The threshold column TM includes the plurality of unit threshold memory cells UTM and a bit line BL2 to which the plurality of unit threshold memory cells UTM are connected. The unit threshold memory cells UTM include the threshold memory devices TM and the threshold pass transistors TP.

The threshold memory devices are resistive memory devices, which are the same as the above-described weight memory devices. For conciseness and clarity, the description is not reiterated. Also, the threshold pass transistors TP are the same as the weight pass transistors. For conciseness and clarity, the description is not reiterated.

In the exemplary embodiment shown in the drawing, the weight pass transistors WP and the threshold pass transistors TP are all n-type metal oxide semiconductor (NMOS) transistors. However, this is merely an exemplary embodiment, and any device may be applied to the weight pass transistors WP and the threshold pass transistors TP as long as the electric resistance between one electrode and another electrode is controlled according to an electric signal provided to a control electrode such as a MOS transistor and a bipolar junction transistor (BJT).

A unit weight memory cell UWM1 stores a single weight value and includes the weight memory devices WM1a and WM1b, which are respectively connected to the weight pass transistors WP1a and WP1b and complementarily store a weight data value. The weight memory devices WM1a and WM1b are both connected to the bit line BL1. The weight pass transistors WP1a and WP1b included in the unit weight memory cell UWM1 are respectively connected to word lines WL1a and WL1b to which complementary control signals are provided and become conductive accordingly.

A unit threshold memory cell UTM1 includes the threshold memory devices TM1a and TM1b, which are respectively connected to the threshold pass transistors TP1a and TP1b and store the same threshold. Both the threshold memory devices TM1a and TM1b are electrically connected to the bit line BL2. The threshold pass transistors TP1a and TP1b included in the unit threshold memory cell UTM1 are respectively connected to the word lines WL1a and WL1b to which complementary control signals are provided and become conductive accordingly.

Figure 2:
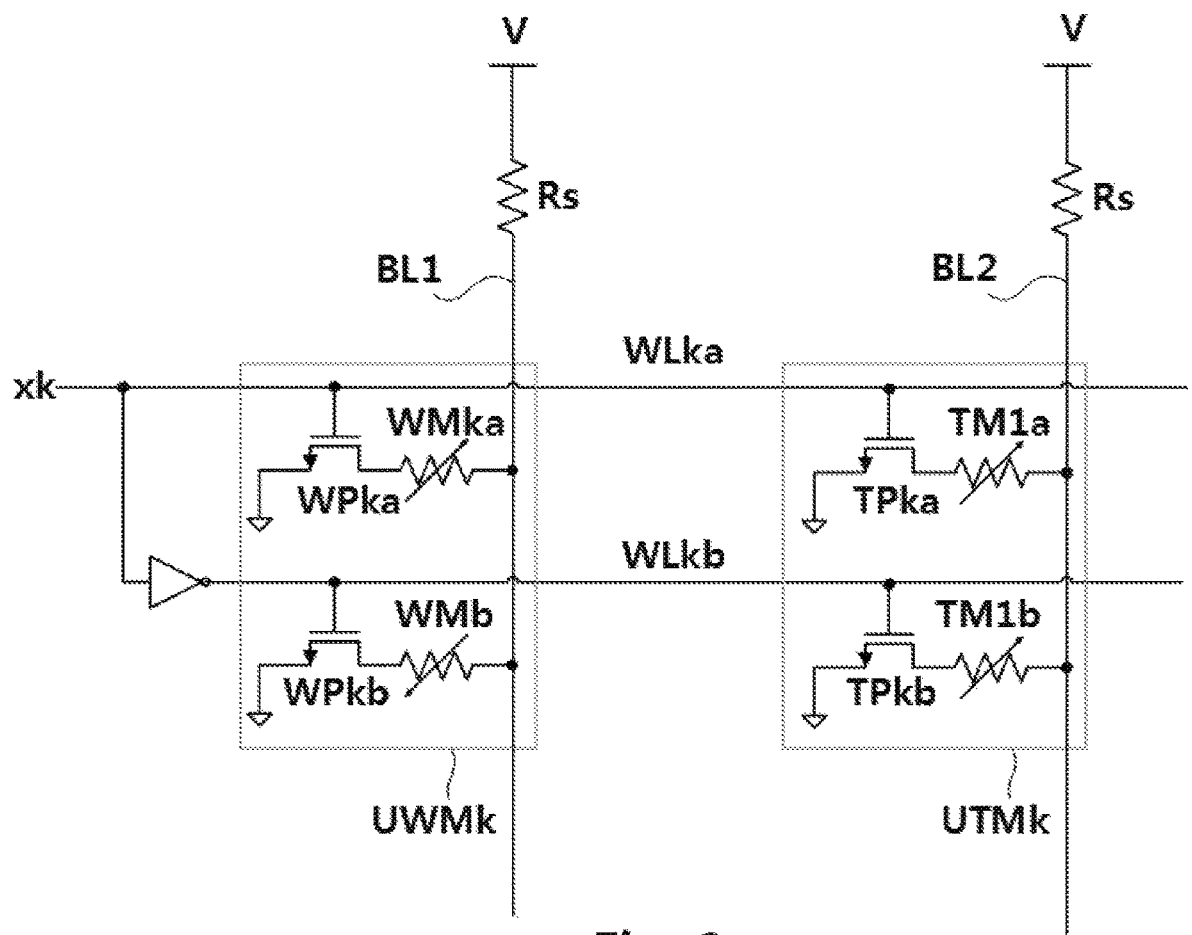
FIG. 2 is a diagram illustrating operation of any one unit weight memory cell and any one unit threshold memory cell.

FIG. 2 is a diagram illustrating operation of any one unit weight memory cell UWM and any one unit threshold memory cell UTM. Referring to FIG. 2, a unit weight memory cell UWMk stores a single weight, which is stored in the weight memory devices WMka and WMkb as pieces of data which are complementary to each other. The weight memory devices WMka and WMkb are connected to word lines WLka and WLkb, respectively, to which complementary control signals are provided.

TABLE 1

| Weight | WMka | WMkb |
|---|---|---|
| +1 | LRS | HRS |
| −1 | HRS | LRS |

(LRS: low resistance state, HRS: high resistance state)

Table 1 shows weights stored in the unit weight memory cell UWMk and relative resistance values of the weight memory devices. Referring to Table 1, assuming that the weight memory device WMka has a low resistance value between one end and the other end when a weight stored in the unit weight memory cell is "+1," the weight memory device WMkb may have a high resistance value, which is complementary to the low resistance value of the weight memory device WMka, between one end and the other end. Also, assuming that the weight memory device WMka has a high resistance value between one end and the other end when a weight stored in the unit weight memory cell is "−1," the weight memory device WMkb may have a low resistance value, which is complementary to the high resistance value of the weight memory device WMka, between one end and the other end.

When a weight stored in a unit weight memory cell is "+1," a signal in a logic high state may be provided as an input xk. In this case, the signal in a logic high state is provided through the word line WLka, and a signal in a logic low state is provided through the word line WLkb. Then, the weight pass transistor WPkb is blocked, but the weight pass transistor WPka becomes conductive. Also, the threshold pass transistor TPka becomes conductive, and the threshold pass transistor TPkb is blocked (case 1).

Further, when a weight stored in a unit weight memory cell is "+1," a signal in a logic low state may be provided as an input xk. In this case, the signal in a logic low state is provided through the word line WLka, and a signal in a logic high state is provided through the word line WLkb. Then, the weight pass transistor WPkb becomes conductive, and the weight pass transistor WPka is blocked. Also, the threshold pass transistor TPka is blocked, and the threshold pass transistor TPkb becomes conductive (case 2).

In case 2, a voltage is provided through the bit line BL1 and the weight memory device WMkb in a high resistance state. Therefore, a current lower than that of case 1, in which the voltage is provided through the weight memory device WMka in a low resistance state, flows through the bit line BL1. However, both the threshold memory devices TMka and TMkb store the same value. Therefore, although different threshold pass transistors become conductive in case 1 and case 2, the same current flows through the bit line BL2. Consequently, it is possible to find the relationship between an output of a corresponding neuron and a batch normalization threshold by comparing voltages flowing through the bit line BL1 and the bit line BL2 with each other.

Operation of the artificial neural network circuit 1 according to this exemplary embodiment will be described below with reference to FIG. 1. An input vector is provided through inputs x1, . . . , and xn. According to the provided inputs, signals corresponding to the inputs and signals complementary to the inputs are provided to the word lines WL1a, WL1b, . . . , WLna, and WLnb so that the weight pass transistors WP1a, WP1b, . . . , WPna, and WPnb and the threshold pass transistors TP1a, TP1b, . . . , TPna and TPnb become conductive.

As the weight pass transistors WP1a, WP1b, . . . , WPna, and WPnb become conductive to correspond to the input vector, a plurality of weight memory devices corresponding to weights stored in the plurality of unit weight memory cells UWM1, . . . , and UWMn constitute a circuit among the voltage rail V, the bit line BL1, and the ground voltage. Signals output from the plurality of weight memory devices overlap through the bit line BL1. A signal output through the bit line BL1 corresponds to an output of any one neuron regarding the input vector.

As the threshold pass transistors TP1a, TP1b, . . . , TPna, and TPnb become conductive, a plurality of threshold memory devices corresponding to thresholds stored in the plurality of unit threshold memory cells UTM1, . . . , and UTMn constitute a circuit among the voltage rail V, the bit line BL2, and the ground voltage. However, since both threshold memory devices included in any one unit threshold memory cell store the same values, the resistance value between the bit line BL2 and the ground voltage is not changed regardless of a pass transistor which becomes conductive in the threshold memory cell.

Signals output from the unit threshold memory cells UTM1, . . . , and UTMn overlap through the bit line BL2. A signal output through the bit line BL2 corresponds to thresholds stored in the unit threshold memory cells UTM1, . . . , and UTMn through a program by a user.

The sense amplifier SA receives an output of any one neuron regarding the input vector through one input terminal connected to the bit line BL1 and receives a threshold through the other input terminal connected to the bit line BL2. The sense amplifier compares the received neuron output with the received threshold and provides an output signal corresponding to the comparison result. As an example, the output signal may be a sign signal representing the comparison result.

Second Embodiment

Figure 3:
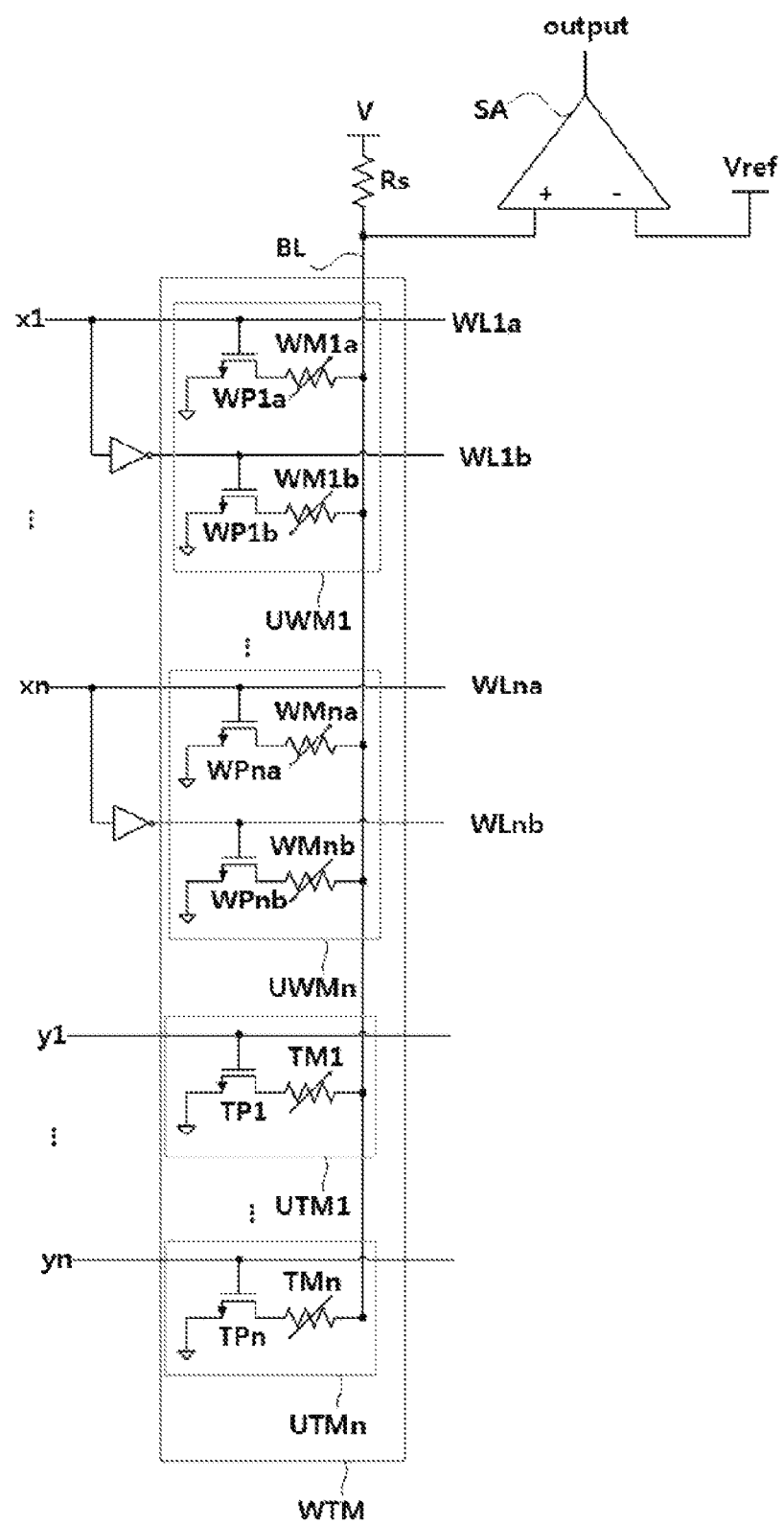
FIG. 3 is a circuit diagram showing an overview of an artificial neural network circuit according to another exemplary embodiment of the present invention.

A second exemplary embodiment of the present invention will be described below with reference to the accompanying drawings. For conciseness and clarity, description of elements which are identical or similar to those in the above-described embodiment may be omitted. FIG. 3 is a circuit diagram showing an overview of an artificial neural network circuit according to this exemplary embodiment of the present invention. Referring to FIG. 3, an artificial neural network circuit 2 according to this exemplary embodiment includes unit weight memory cells UWM including weight memory devices WM configured to store weight data and weight pass transistors WP, unit threshold memory cells UTM including a threshold memory device TM programmed to store a threshold and a threshold pass transistor TP, a weight-threshold column WTM in which the plurality of unit weight memory cells UWM and the plurality of unit threshold memory cells UTM are connected, and a sense amplifier SA configured to receive an output signal of the weight-threshold column WTM as an input and receive a reference voltage Vref as another input.

A unit weight memory cell UWM1 stores a weight value. The unit weight memory cell UWM1 includes weight memory devices WM1a and WM1b, which are respectively connected to weight pass transistors WP1a and WP1b and store complementary data values. The weight memory devices WM1a and WM1b are both connected to a bit line BL.

As described in the above exemplary embodiment, the weight pass transistors WP1a and WP1b included in the unit weight memory cell UWM1 are respectively connected to word lines WL1a and WL1b to which complementary control signals are provided and become conductive accordingly. The unit threshold memory cells UTM include the threshold memory device TM configured to store threshold data and the threshold pass transistor TP configured to control circuit connection between the bit line BL and the threshold memory device TM.

Unit threshold memory cells UTM1, . . . , and UTMn are respectively provided with control signals y1, . . . , and yn and become conductive. As an example, in the case of programming the unit threshold memory cells UTM1, . . . , and UTMn with thresholds, the control signals y1, . . . , and yn are respectively provided to the unit threshold memory cells UTM1, . . . , and UTMn so that data may be stored in threshold memory devices TM1, . . . , and TMn. As another example, in the case of operating the artificial neural network circuit 2, the control signals y1, . . . , and yn are provided so that threshold pass transistors TP1, . . . , and TPn may become conductive.

Thresholds stored in the unit threshold memory cells UTM1, . . . , and UTMn are stored by using an opposite sign convention to weight values stored in the unit weight memory cells UWM1, . . . , and UWMn. For example, when a weight value stored in a weight memory cell is "+1," a low resistance value is obtained between one end and the other end of the weight memory device WMa, but when a threshold stored in a unit threshold memory cell UTM is "+1," the threshold memory device TM has a high resistance value.

The plurality of unit weight memory cells UWM1, . . . , and UWMn and the plurality of unit threshold memory cells UTM1, . . . , and UTMn are connected to the same bit line BL.

Operation of the artificial neural network circuit 2 according to this exemplary embodiment will be described below with reference to FIG. 3. For conciseness and clarity, description of elements which are identical or similar to those in the above-described embodiment may be omitted. When an input vector is provided through inputs x1, . . . , and xn, corresponding weight pass transistors become conductive, and a circuit is formed among a voltage rail V, weight memory devices WM, and the ground voltage. Therefore, the plurality of unit weight memory cells UWM1, . . . , UWMn output outputs of neurons regarding the input vector through the bit line BL.

As described above, whenever the artificial neural network circuit 2 is operated, the threshold pass transistors TP1, . . . , and TPn become conductive, and thus output currents corresponding to the programmed thresholds are provided through the bit line BL. Currents corresponding to the outputs of the neurons output by the plurality of unit weight memory cells UWM1, . . . , and UWMn and the output currents corresponding to the programmed thresholds flow together in the bit line BL. However, since the thresholds stored in the unit threshold memory cells UTM1, . . . , and UTMn have an opposite sign convention to weight values stored in the unit weight memory cells UWM1, . . . , and UWMn, a component of a current flowing through the bit line BL corresponds to a difference obtained by subtracting a threshold from an output signal of a neuron.

One input terminal of the sense amplifier SA is connected to the bit line BL, and the other input terminal is connected to the reference voltage Vref. Therefore, the sense amplifier SA outputs a result obtained by comparing the reference voltage Vref representing 0 with a difference, which is obtained by subtracting a threshold from an output signal of a neuron and provided through the bit line BL.

Although only a single weight-threshold column is shown in the exemplary embodiment of FIG. 3, this is a mere example, and a plurality of weight-threshold columns may be included in an embodiment not shown in the drawings.

According to an exemplary embodiment of the present invention, a digital-to-analog converter (DAC) is not used to convert a digital code for batch normalization into an analog voltage, and thus it is possible to reduce area consumption and power consumption. Also, since it is possible to use a sense amplifier having a smaller dynamic range than a sense amplifier of a related art, area consumption may be further reduced.

Although exemplary embodiments of the present invention have been described in detail with reference to the accompanying drawings, the embodiments are merely examples, and those of ordinary skill in the art will appreciate that various modifications and equivalents may be made from the exemplary embodiments. Therefore, the technical scope of the present invention should be determined by the following claims.

What is claimed is:

1. An artificial neural network circuit comprising:
   a weight column in which unit weight memory cells including weight memory devices configured to store weight data of one neuron and weight pass transistors are connected; and
   a threshold column in which unit threshold memory cells including threshold memory devices configured to store a threshold of a neuron and threshold pass transistors are connected,
   wherein the unit weight memory cells include first and second weight pass transistors,
   the unit threshold memory cells include first and second threshold pass transistors,
   the first weight pass transistor is connected to the same word line as the first threshold pass transistor,
   the second weight pass transistor is connected to the same word line as the second threshold pass transistor, and
   complementary signals are provided to the word line to which the first weight pass transistor and the first threshold pass transistor are connected and the word line to which the second weight pass transistor and the second threshold pass transistor are connected.

2. The artificial neural network circuit of claim 1, wherein the weight column further includes a first bit line to which the plurality of unit weight memory cells are connected, and the threshold column further includes a second bit line to which the plurality of unit threshold memory cells are connected.

3. The artificial neural network circuit of claim 1, wherein the unit weight memory cells include first and second weight memory devices configured to complementarily store weight data,
- the first and second weight pass transistors configured to control provision of an electrical signal to the first and second weight memory devices respectively, and
- the first and second weight pass transistors are controlled to be conductive exclusively with each other.

4. The artificial neural network circuit of claim 1, wherein the unit threshold memory cells include first and second threshold memory devices configured to store a threshold, and
- the first and second threshold pass transistors configured to control provision of an electrical signal to the first and second threshold memory devices, respectively.

5. The artificial neural network circuit of claim 1, further comprising a sense amplifier configured to compare output signals of neurons output by the weight column with threshold signals output by the threshold column and output comparison results.

6. The artificial neural network circuit of claim 5, wherein the weight memory devices and the threshold memory devices are resistive memory devices,
- the weight pass transistors are controlled by an input provided to the word lines so that a voltage provided to a first input of the sense amplifier is changed, and
- the threshold pass transistors are controlled by the input provided to the word lines so that a voltage provided to a second input of the sense amplifier is changed.

7. The artificial neural network circuit of claim 1, wherein the threshold signals correspond to batch normalization thresholds of neurons.

8. The artificial neural network circuit of claim 1, wherein the thresholds are programmed and provided.

* * * * *